(12) United States Patent
Walker

(10) Patent No.: US 6,934,180 B1
(45) Date of Patent: Aug. 23, 2005

(54) RANDOM ACCESS MEMORY CELL HAVING REDUCED CURRENT LEAKAGE AND HAVING A PASS TRANSISTOR CONTROL GATE FORMED IN A TRENCH

(76) Inventor: Darryl G. Walker, 4064 Beebe Cir., San Jose, CA (US) 95135

( * ) Notice: Subject to any disclaimer, the term of this patent is extended or adjusted under 35 U.S.C. 154(b) by 0 days.

(21) Appl. No.: 10/675,042

(22) Filed: Sep. 29, 2003

Related U.S. Application Data

(60) Continuation of application No. 09/546,747, filed on Apr. 11, 2000, now Pat. No. 6,661,699, which is a division of application No. 09/072,879, filed on May 5, 1998, now Pat. No. 6,064,589.

(60) Provisional application No. 60/073,349, filed on Feb. 2, 1998.

(51) Int. Cl.[7] .............................................. G11C 11/24
(52) U.S. Cl. ................. 365/149; 365/222; 365/230.06; 257/297; 257/306; 257/310
(58) Field of Search .......................... 365/222, 230.06, 365/149; 257/296, 297, 306, 310, 311

(56) References Cited

U.S. PATENT DOCUMENTS

| | | | |
|---|---|---|---|
| 5,995,410 A * | 11/1999 | Forbes ........................ | 365/149 |
| 6,064,589 A | 5/2000 | Walker ........................ | 365/149 |
| 6,262,448 B1 | 7/2001 | Enders et al. ................ | 257/302 |
| 6,459,123 B1 | 10/2002 | Enders et al. ................ | 257/331 |
| 6,472,767 B1 | 10/2002 | Enders et al. ................ | 257/903 |
| 6,503,784 B1 | 1/2003 | Enders et al. ................ | 438/199 |
| 6,661,699 B1 * | 12/2003 | Walker ........................ | 365/149 |
| 6,807,604 B2 * | 10/2004 | Duranton .................... | 711/106 |

* cited by examiner

Primary Examiner—Andrew Q. Tran
(74) Attorney, Agent, or Firm—Bradley T. Sako

(57) ABSTRACT

A dynamic random access memory (DRAM) cell and associated array are disclosed. The DRAM cell (300) includes a storage capacitor (304) and a pass transistor (302). The pass transistor (302) includes a source region (322), drain region (320) and channel region (324). A top gate (318) is disposed over the channel region (324) and a bottom gate (310) is disposed below the channel region (324). The top gate (318) and bottom gate (310) are commonly driven to provide greater control of the pass transistor (302) operation, including an off state with reduced source-to-drain leakage. The DRAM array (400) includes memory cells (414) having pass transistors (500) with double-gate structures. Memory cells (414) within the same row are commonly coupled to a top word line and bottom word line. The resistance of the top and bottom word lines is reduced by a word line strap layer (600). The DRAM array (400) further includes a strapping area that is void of memory cells. Conductive contact between the top word line, bottom word line, and word line strap layer (600) of each row is made within the strapping area by way of strapping vias (604) and top-to-bottom word line vias (602).

21 Claims, 3 Drawing Sheets

RANDOM ACCESS MEMORY CELL HAVING REDUCED CURRENT LEAKAGE AND HAVING A PASS TRANSISTOR CONTROL GATE FORMED IN A TRENCH

CROSS REFERENCE TO RELATED APPLICATIONS

This application is a continuation of U.S. patent application Ser. No. 09/546,747, filed Apr. 11, 2000, now U.S. Pat. No. 6,661,669, which is a divisional of Ser. No. 09/072,879, now U.S. Pat. No. 6,064,589 filed May 5, 1998, which is based on provisional application No. 60/073,349 filed on Feb. 2, 1998.

TECHNICAL FIELD

The present invention relates generally to semiconductor devices, and more particularly to dynamic random access memory (DRAM) storage cells and arrays.

BACKGROUND OF THE INVENTION

A dynamic random access memory (DRAM) includes a large number of memory cells, each of which can store at least one bit of data. The memory cells are arranged in an array having a number of rows and columns. Memory cells within the same row are commonly coupled to a word line and memory cells within the same column are commonly coupled to a bit line. The memory cells within the array are accessed according to various memory device operations. Such operations include read operations, write operations and refresh operations.

In a typical memory cell read operation, an external memory address is applied which results in the activation of a word line. When activated, the word line couples the data stored within the memory cells of its respective row to the bit lines of the array. In typical DRAM, the coupling of memory cells results in a differential voltage appearing on a bit line (or bit line pair). The differential voltage is amplified by a sense amplifier, resulting in amplified data signals on the bit lines. The applied memory address also activates column decoder circuits, which connect a given group of bit lines to input/output circuits. Commonly, the memory address is multiplexed, with a row address being applied initially to select a word line, and a column address being applied subsequently to select the group of bit lines.

The typical DRAM memory cell stores data by placing charge on, or removing charge from, a storage capacitor. Over time, this charge is reduced by way of a leakage current. Thus, it is important for the DRAM to restore the charge on the capacitor before the amount of charge falls below a critical level, due to leakage mechanisms. Restoration of charge is accomplished with a refresh operation.

The critical level of charge for a storage capacitor is determined by the sensitivity of the memory device sense amplifiers. The storage capacitor must have enough charge to create a sufficient differential voltage for the sense amplifier to reliably sense, without producing an erroneous output. The time needed before the charge on the capacitor falls below the critical level is commonly referred to as the maximum "pause" period. A DRAM must perform a refresh operation on every row in the device before that row experiences the maximum "pause" period. Read operations and write operations will also serve to refresh the memory cells of a row.

As DRAMs are being used in battery operated applications, such as laptop computers, it is crucial to reduce the power consumed by DRAMs, and thus allow a longer battery lifetime for battery operated systems. Every refresh operation a DRAM must perform consumes a considerable amount of power. This power is wasted because it is not typically performed to transfer data to or from the DRAM for the system's needs. The refresh operation is used only to sustain the data integrity in the DRAM. Thus, it is important to reduce the number of refresh operations needed over time. One way of achieving this goal is to reduce the rate of charge leakage from the storage capacitor.

To better understand the distinguishing features and advantages of the present invention, a prior art DRAM will be discussed. Referring now to FIG. 1, a DRAM array is set forth and designated by the general reference character 100. The DRAM array 100 is arranged as an n×m array, having n rows and m columns. The DRAM array 100 includes a word line driver bank 102 coupled to n sets of word lines (WL0–WLn), as well as a sense amplifier bank 104, coupled to m sets of bit line pairs (BL0, BL0_ –BLm, BLm_). A memory cell is formed where a word line intersects a bit line pair. The memory cells are designated as M00–Mnm, where the first digit following the "M" represents the physical row of the memory cell's location, and the second digit represents the physical column of the memory cell's location. For example, M00 is the memory cell located at the intersection of WL0 and bit line pair BL0, BL0_. Each memory cell (M00–Mnm) contains a pass transistor (shown as n-channel MOSFETs Q00–Qnm) and a storage capacitor (shown as C00–Cnm). Each memory cell further includes a storage node 106–112 formed at the junction of the source of the pass transistor (Q00–Qnm) and its associated storage capacitor (C00–Cnm).

The word line driver bank 102 is separated into n separate word line driver circuits shown as DRV0–DRVn. The word line driver bank 102 is responsive to a row address (not shown) such that only one word line driver circuit (DRV0–DRVn) will drive its corresponding word line high according to the row address received. For example, word line driver circuit DRV0 will drive word line WL0 high when the row address value of "zero" is received, and word line driver circuit DRVn will drive word line WLn high when the row address value of "n" is received.

The sense amplifier bank 104 is separated into m separate sense amplifier circuits, shown as SA0–SAm. For reasons discussed below, while all of the sense amplifiers 104 will be activated simultaneously, only selected of the sense amplifiers in the sense amplifier bank 104 will pass its sensed data to the DRAM output (not shown). A sense amplifier (SA0–SAm) will be selected according to the column address (not shown) applied to a column decoder (also not shown) in the DRAM.

Data is stored in the DRAM array 100 by placing or removing charge from the storage capacitors (C00–Cnm). In a write cycle, a row address is applied to the DRAM and will activate a word line. In this example assume a logic value "1" is to be written into memory cell M00. Word line driver circuit DRV0 within the word line driver bank 102 will raise word line WL0 to a high logic level. A column address will couple write circuitry (not shown) to bit line BL0 to allow a high logic level to be written into storage cell M00. The high logic level will be stored in memory cell M00 at storage node 106 by placing charge on storage capacitor C00. In order to ensure maximum charge is placed on the storage capacitor, word line driver circuit DRV0 will raise word line WL0 to a voltage level that is at least one n-channel threshold voltage (Vtn) above the voltage level applied to bit line BL0 during the write cycle.

Once storage node 106 reaches a high logic level, which is typically equal to the high power supply voltage (Vcc) of the DRAM array 100, the DRAM is allowed to go into a precharge state in which word line WL0 will be driven to a low logic level, for example the low power supply voltage (Vss). In this state, the storage node 106 will be isolated from the bit line BL0 as the pass transistor Q00 will be in a non-conducting state.

Because the leakage characteristics of the storage capacitor C00 and pass transistors Q00 are not ideal, once the storage node 106 becomes isolated from the bit line BL0, the charge stored on the storage capacitor C00 will leak away, and the voltage will slowly be reduced. As mentioned previously, the charge on the storage capacitor C00 must be restored before the charge level falls below the critical level. This helps to ensure that the data will be reliably sensed by sense amplifier SA0. The data may be restored during either a read operation or a refresh operation, as determined by control signals (not shown) that may be applied to the DRAM. In both cases, the data of a complete row of DRAM cells will be restored.

In order to restore the data in the row formed by word line WL0, word line driver WL0 will be activated, raising word line WL0 at least one Vtn above the DRAM array 100 high power supply voltage Vcc. As a result, the pass transistors connected to word line WL0 are turned on, coupling the storage nodes of the row to their respective bit lines BL0–BLm. This creates a differential voltage across the bit line pairs (BL0, BL0_–BLm, BLm_) having a value that is dependent upon the data stored at the accessed storage nodes. For example, as noted above, storage node 106 has a logic level "1" stored on it, thus, bit line BL0 will rise to a potential that is slightly higher than the potential of bit line BL0_ at the beginning of the read or refresh cycle. Conversely, if the storage node 106 had stored a logic level of "0", the bit line BL0 would achieve a lower voltage than bit line BL0_.

Shortly after the differential voltage is achieved on the bit lines (BL0, BL0_–BLm, BLm_), the sense amp bank 104 is activated. When activated, these sense amplifiers (SA0–SAm) "sense" (amplify) the voltage differential on the bit lines pairs (BL0, BL0_–BLm, BLm_), resulting in an output having a full logic logic level (either Vcc or Vss, depending upon the logic level stored in the memory cell).

Because the pass transistors coupled to word line WL0 are still turned on, the amplifying operation of each sense amplifier (SA0–SAm) will apply complementary full logic levels to its respective bit line pair (BL0, BL0_ to BLm, BLm_). In the particular example described herein, because memory cell M00 stores a logic "1", sense amplifier SA0 will apply a voltage level of Vcc to bit line BL0 and a voltage of Vss to bit line BL0_. With word line WL0 at a voltage at least one Vtn above Vcc, a full Vcc level will be applied back to the storage node 106. In this manner, the voltage level on the storage node 106 is restored. Likewise, all of the memory cells coupled to word line WL0 will have their data restored to a full logic level (Vcc or Vss in the example of FIG. 1).

As mentioned above, a read or refresh operation must be performed on each row in the DRAM before the charge level on the storage node 106 falls below the critical level. Thus, it is important to make the pass transistor Q00 and storage capacitor C00 as ideal (non-leaky) as possible. Furthermore, the critical charge level is dependent upon the capacitance of the storage capacitor C00: The larger the capacitance, the greater amount of charge that can be stored on the capacitor. Having more charge on the capacitor means that more charge can be lost before the total charge on the capacitor falls below the critical level. Thus, it is important to construct storage capacitors to have as large a capacitance as possible. At the same time, while it is desirable to increase capacitor size, it is also desirable to reduce the overall size of the DRAM.

Referring to FIG. 2, memory cell M00 of FIG. 1 is set forth in a side cross-sectional view. The memory cell M00 is designated by the general reference character 200, and is shown to include a pass transistor 202, and a storage capacitor 204 formed on a substrate 206. The pass transistor 202 couples the storage capacitor 204 to a bit line 208 in order to allow data to be read from, written to, or refreshed in the memory cell 200.

The storage capacitor 204 includes a storage node 210 and a top plate 212 that are separated by a capacitor dielectric 214. The storage node 210 is formed from polysilicon and is coupled to the pass transistor 202. The capacitor dielectric 214 may be silicon dioxide ($SiO_2$). Alternatively, the capacitor dielectric 214 could be a silicon dioxide-silicon nitride-silicon dioxide ($SiO_2$—$Si_3N_4$—$SiO_2$) combination, which can increase the capacitance of the capacitor due to the increased dielectric constant properties of the silicon nitride ("nitride") layer. The top plate 212 is formed from polysilicon, and all storage cells on the DRAM array may share the same top plate 212. The top plate 212 may have a voltage equivalent to Vcc/2, to reduce the electric field across the capacitor dielectric 214.

The capacitance of the storage capacitor 204 is determined by the surface area of the storage node 210, the dielectric constant of the capacitor dielectric 214, and the thickness of the capacitor dielectric 214 (the distance between the top plate 212 and the storage node 210). As noted above, while it is desirable to increase the capacitance of the memory cell 200, it is also desirable to do so without increasing the area of the DRAM storage cell, in order to not increase the overall size of the DRAM device.

The pass transistor 202 is shown to include a source region 216 and a drain region 218 formed within the substrate 206. The pass transistor 202 also includes a control gate 220 placed between the source region 216 and drain region 218, and separated from the substrate 206 by a thin control dielectric 222. The substrate 206 is P-type doped monocrystalline silicon and the source region 216 and drain region 218 are N-type doped silicon. The control gate 220 is polysilicon, and the thin control dielectric 222 may be silicon dioxide ("oxide"), or a combination oxide-nitride layer. The pass transistor 202 is coupled to the storage capacitor 204 via the drain region 218. The pass transistor 202 is further coupled to a bit line contact 224, via the source region 216. The contact 224 is coupled to a bit line 208. The bit line 208 is a metal, for example Al, or alternatively, a titanium-tungsten combination (TiW).

In operation, when the control gate 220 is more than one threshold voltage above the potential of the source region 216, a low impedance path is formed between the storage node 210 and the bit line 208. In this manner, data can be read from, written to, or restored at the storage node 210. However, if the control gate 220 is at a voltage less than the threshold voltage of the pass transistor 202 (with respect to the source region 216), the pass transistor 202 forms a high impedance path between the storage capacitor 204 and the bit line 208. In this manner, the storage node 206 is isolated from the bit line 208, and only unwanted leakage mechanisms may interfere with the data integrity.

One such unwanted leakage mechanism is current leaking from the drain region 218 to the source region 216 of the pass transistor 202. This current is represented by the character "Ileak" in FIG. 2. The current Ileak can be problematic, due to short channel effects as the distance between the drain region 218 and the source region 216 is reduced. This raises a barrier to the limit to which transistor dimensions can be shrunk, which in turn, places a limitation on how small a DRAM array can be. Short channel effects will further effect the reliability of adjusting the threshold voltage of the pass transistor 202. Because the operation of the pass transistor 202 is dependent upon its threshold, it would be desirable to have greater control over the channel region of the pass transistor 202.

The control gate 220 runs the full length of the DRAM array in the x-direction, forming the word line shown as WL0 in FIG. 1. Referring back to FIG. 1, each word line is shown to be coupled to the control gate of all the DRAM cells in that particular row. This arrangement results in a relatively large capacitive load on the word line. In order to reduce the speed required to drive the word line between high and low voltages, it is desirable to make the word line have as little resistance as possible. As mentioned above, the control gate 212 is made of polysilicon, which has a higher resistance than metal layers. The polysilicon word line resistance may be reduced by forming a self-aligned silicide (salicide) structure on it. Alternatively, a metal layer may run parallel and over the polysilicon, and be periodically connected to the polysilicon by way of contacts. Such a structure is often referred to as a "strapped" word line.

It would be desirable to form a DRAM storage cell with a high storage capacitance and a low amount of charge leakage through the channel region of the pass transistor. Furthermore, it is desirable to do so while maintaining a compact memory cell size, and high speed memory cell and memory cell array performance.

SUMMARY OF THE INVENTION

According to the present invention, a dynamic random access memory (DRAM) cell includes a pass transistor and a charge storage device. The pass transistor is double-gated, having both a top gate and a bottom gate. The double-gate structure provides greater control over the channel region, resulting in advantageous charge storage capabilities. In addition, the double-gate structure allows for shorter channel dimensions, improving the density of DRAM arrays employing the preferred embodiment memory cell.

According to one aspect of the preferred embodiment, the DRAM cell pass transistor is a silicon-on-insulator device.

According to another aspect of the preferred embodiment, the DRAM cell pass transistor is isolated from adjacent devices by etching a silicon layer to form active area silicon mesas.

According to another aspect of the preferred embodiment, the DRAM cell includes a stacked capacitor.

An advantage of the preferred embodiment is that it provides a DRAM cell having low leakage characteristics and reduced silicon area.

DETAILED DESCRIPTION OF THE EMBODIMENTS

Figure 1:
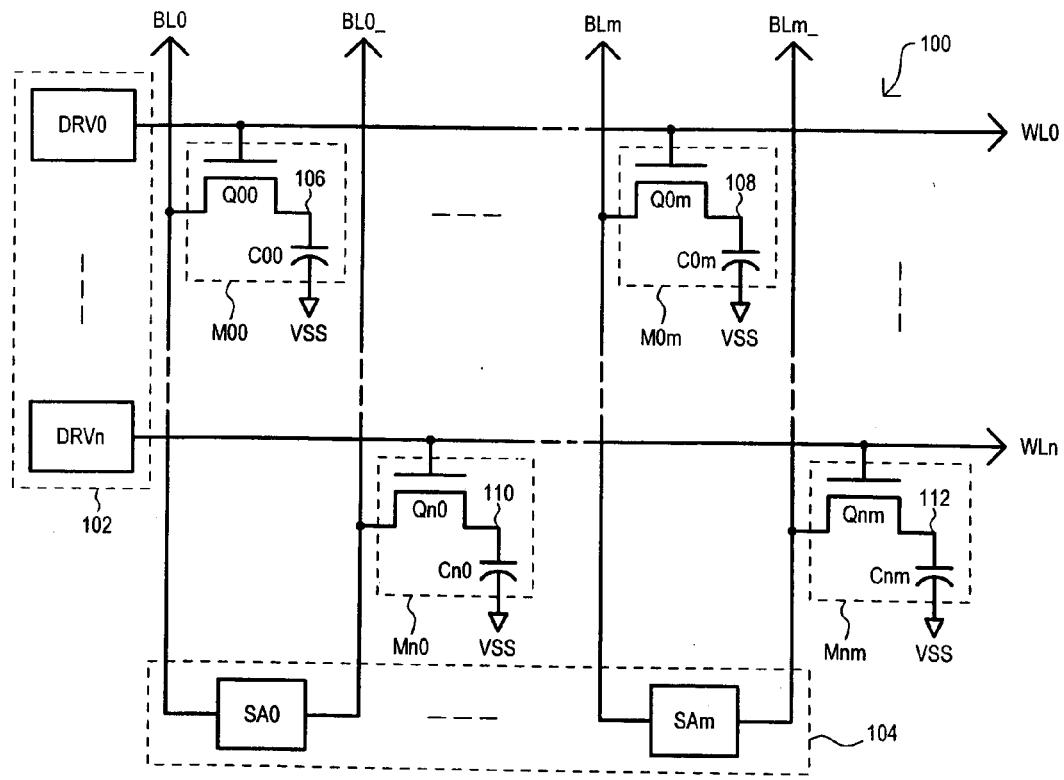
FIG. 1 is a block schematic diagram of a prior art DRAM array.

The preferred embodiment is a novel memory cell that can be used in dynamic random access memory (DRAM). The novel memory cell includes a storage capacitor and pass transistor. The preferred embodiment storage capacitor has increased capacitance, and the pass transistor has reduced source-to-drain leakage. The novel memory cell is set forth in a side cross sectional diagram in FIG. 3. The memory cell is designated by the general reference character 300 and is formed using silicon-on-insulator (SOI) technology. The memory cell 300 includes a pass transistor 302 and a storage capacitor 304, both formed on a substrate insulator layer 306. The substrate insulator layer 306 is formed over a semiconductor substrate 308.

The pass transistor 302 includes a bottom gate 310, a bottom gate insulating layer 312, a silicon mesa 314, a top gate insulating layer 316, and a top gate 318. The silicon mesa 314 further includes a drain region 320, a source region 322, and a channel region 324. The storage capacitor 304 is shown to include a storage node 326 and a common plate 328 separated by a capacitor dielectric 330. The drain region 320 of the pass transistor 302 is coupled to the storage capacitor 304. The source region 322 of the pass transistor 302 is coupled to a contact region 332. The contact region 332, in turn, couples the source region 322 of the pass transistor 302 to a bit line 334. In the preferred embodiment 300, the source region 322 is shared with an adjacent pass transistor (a portion of which is shown to the left of pass transistor 302 in FIG. 3).

In the preferred embodiment 300, the memory cell further includes a strapping layer 336 disposed above the bit line 334. As will be described in more detail below, the strapping layer 336 is coupled to top gate 318 and/or the bottom gate 310 to provide a lower overall word line resistance.

The substrate 308 can be formed from P-type monocrystalline silicon. Alternatively, the substrate 308 can by formed from N-type monocrystalline silicon. An N-type substrate will be doped with phosphorous or arsenic, while a P-type substrate will be doped with boron. In the particular embodiment of FIG. 3, a P-type substrate is used. The substrate insulating layer 306 is formed by implanting oxygen in the substrate 308, and then performing an annealing step to form an insulating layer of silicon dioxide ($SiO_2$).

Following the formation of the substrate insulating layer 306, a reactive ion etching step can be used to create a trench within the substrate insulating layer 306. A layer of amorphous polysilicon is deposited over the etched insulating layer 306, with the thickness of the polysilicon layer being sufficient to completely fill the trench. The amorphous polysilicon can then doped with arsenic and/or phosphorous to improve its conductivity. A chemical-mechanical polishing (CMP) step is then performed to remove, in a planar fashion, all of the amorphous silicon, except for the portion that fills the trench. The resulting structure forms the bottom gate 310. It is understood that the bottom gate 310 extends along a portion of, or the entire length of, a memory cell array in the row direction. For this reason, the bottom gate 310 is further designated as a bottom word line (WLB) in FIG. 3. A bottom gate for the adjacent pass transistor is also formed at this time.

After the formation of the bottom gate 310, a bottom gate insulating layer 312 is formed. The bottom gate insulating layer 312 may be thermally grown $SiO_2$, or alternatively, a combination of a thermally grown $SiO_2$ followed by a thin layer of silicon nitride deposited using a chemical vapor deposition (CVD) step.

The silicon mesa 314 is formed on the bottom gate insulating layer 312 by first forming a thin layer of monocrystalline silicon, by epitaxial lateral growth, or selective epitaxial growth. Preferably, the epitaxial silicon has a thickness of about 1500 angstroms. The silicon mesa 314 is doped with boron to create P-type doped silicon. In the creation of the preferred embodiment 300, during the epitaxial growth step, silicon is grown over the chip area as a single layer. Transistor active areas are then formed by a pattern and etch step, which creates a number of isolated silicon mesas (including the silicon mesa 314). Alternatively, active areas may be created by a local oxidation of silicon (LOCOS) step performed on the epitaxial silicon. In the preferred embodiment 300, because the source region 322 (and contact region 332) are shared by an adjacent pass transistor, the resulting mesa will include enough area to form the drain region 320, channel region 324, the shared source region 322, and in addition, a channel region and drain region for the adjacent pass transistor.

Once an isolated silicon mesa 314 is formed, the top gate insulating layer 316 is created on the top surface of the silicon mesa 314. The top gate insulating layer 316 may be thermally grown $SiO_2$, or alternatively, a combination of a thermally grown $SiO_2$ layer followed by a thin layer of CVD silicon nitride.

In the preferred embodiment 300, to ensure that the top gate 318 is driven in tandem with the bottom gate 310, both the top gate 318 and bottom gate 310 are electrically connected. Accordingly, following the formation of the top gate insulating layer 320, an etch step is performed to create a top-to-bottom gate via (not shown). The top-to-bottom gate via is formed in an area of the array that is void of memory cells. For example, a memory array incorporating the preferred embodiment memory cell 300 could include a "strapping area" that is a strip running parallel to the column direction within the array. The strapping area can serve as a location for other contacts, as will be described below. This arrangement allows word line via connections within the array to be made in a single strip, allowing the remainder of the array to have a compact configuration.

Following the top-to-bottom gate via etch, a polysilicon layer is deposited over top gate insulating layer 316. Due to the top-to-bottom gate via, the polysilicon layer will make ohmic contact with the bottom gate 310. A pattern and etch step is then used to create the top gate 318 that runs over, and parallel to, the bottom gate 310. It is understood that the top gate 318, like the bottom gate 310, extends along a portion of, or the entire length of, a memory cell array in the row direction. Thus, the top gate 318 is also designated as a top word line (WLT) in FIG. 3. A top gate for the adjacent pass transistor is also formed at this time.

A layer of CVD $SiO_2$ is deposited over the top gate 318, and subsequently etched to create oxide "sidewalls" on the edges of the top gate 318. Blanket ion implantation of phosphorous and arsenic is performed, to create an N-type drain region 320 and an N-type source region 322 that are self-aligned with the top gate 318. The drain region of the adjacent transistor is also formed at this time. The common source region 322 is thus self-aligned with top gate 318, and a top gate of the adjacent transistor. The blanket implant of phosphorous and arsenic also serves to reduce the resistance of the top gate 318. After a thermal annealing step, the top gate 318, drain region 320, and source region 322, may have their effective resistance reduced with the formation of a self-aligned silicide (salicide), by the deposition of a metal, for example titanium (Ti), platinum (Pt), cobalt (Co) or nickel (Ni), followed by a furnace anneal to form the salicide structure.

The sharing of the source region 322 with an adjacent pass transistor allows for the single silicon mesa 314 to include two pass transistors in a very close proximity to one another. This aspect of the preferred embodiment 300 provides for a compact memory cell arrangement, which can substantially reduce overall DRAM array size.

It is noted that while the bottom gate 310 and top gate 318 of the preferred embodiment are formed from polysilicon, other conductive materials could also be employed. As just one example, tantalum (Ta) may be deposited and etched to form a bottom and/or top gate structure. Such a Ta deposition step could include a sputtering deposition carried out by a dual frequency-excitation process.

A first interlevel isolation layer 338 is formed over the pass transistor 302 structure. In the preferred embodiment 300, the first interlevel isolation layer 338 is borophosphosilicate glass (BPSG) deposited by CVD. For increased planarization, and hence improved topography for subsequent fabrication steps, the BPSG is subjected to a reflow step.

The BPSG is then patterned and etched to create a contact hole above the drain region 320. A conductive layer is then deposited and subsequently patterned to form the storage node 326. In the preferred embodiment 300, the storage node 326 may be formed by a low pressure CVD textured, or rugged hemispherical-grain, polysilicon layer. The use of textured or hemispherical-grain polysilicon increases the surface area of the storage node 326, which in turn will increase the capacitance of the resulting storage capacitor 304. The capacitor dielectric 330 is formed on the storage node 326, and in the preferred embodiment, may be a multi-layered dielectric of $SiO_2/Si_3N_4/SiO_2$ ("ONO"). The ONO capacitor dielectric 330 may be created by the thermal oxidation of the storage node 326, followed by low pressure CVD $Si_3N_4$, and then thermal oxidation of the $Si_3N_4$. Once the capacitor dielectric 330 is complete, the common plate 328 is formed over the capacitor dielectric 330 (and over the capacitor dielectrics of other storage capacitors in an array). In the preferred embodiment 300, the common plate 328 is formed from a layer of deposited polysilicon.

The stacked capacitor provides increased capacitance by extending above and over its associated pass transistor. Thus, the combination of the pass transistor with a low leakage double-gate pass transistor provides a memory cell with and increased capacitance and low leakage characteristics.

While the preferred embodiment capacitor dielectric 330 is an ONO dielectric film, it may be desirable to use other materials to improve the capacitance or the reliability of the resulting memory cell. One such material may be a dual layer film of $SiO_2/Si_3N_4$ (ON). Yet another example could include a single layer film of $SiO_2$. The use of $SiO_2$ would give less capacitance/area given the same thickness as the ONO dielectric film. In addition, because tunneling across the capacitor dielectric 330 may represent a significant amount of leakage for very thin capacitor dielectrics, another alternative approach to forming the capacitor dielectric 330 could include the rapid thermal nitridation of the storage node 326, prior to the chemical vapor deposition of the $Si_3N_4$. It may also be desirable to perform an in situ surface cleaning of the native polysilicon storage node 326 layer before the rapid thermal nitridation, with the remaining capacitor dielectric formation steps being carried out in an identical chamber process.

Materials having a dielectric constant greater than that of silicon oxide and/or silicon nitride may also be employed to increase the capacitance of the storage capacitor 304. As just one example, a tantalum pentoxide ($Ta_2O_5$) film may be formed over the storage node 326. This may be accomplished by low-pressure or plasma enhanced chemical vapor deposition, followed by a high temperature annealing step. In addition, it noted that the storage node 326 surface may be treated by rapid thermal nitridation in $NH_3$ prior to the deposition of $Ta_2O_5$. Other high dielectric materials that may be employed as capacitor dielectrics include epitaxially grown $SrTiO_3$ (strontium titanium oxide) or $BaSrTiO_3$ (barium strontium titanium oxide) or PZT (lead zirconate titanium).

It is also understood that while the preferred embodiment 300 includes a storage node 326 and common plate 328 formed from polysilicon, other conductive materials could be employed. For example, titanium-nitride (TiN) or aluminum (Al) may be used to form the common plate 328. Alternatively, a multi-layered material, such as a TiN/polysilicon material could be used to form the common plate 328.

It is further noted that at the same time the storage capacitor 304 is being formed, a similar storage capacitor is formed simultaneously, for the adjacent pass transistor. The storage node and capacitor dielectric of the adjacent storage capacitor are isolated from storage capacitor 304. However, the common plate 328 is shared, not only with the adjacent storage capacitor, but also with a plurality of other storage capacitors within an array.

Referring once again to FIG. 3, it is shown that a second interlevel isolation layer 340 is formed over the completed storage capacitor 304. The second interlevel isolation 340 is subjected to a contact etch step, which results in a contact hole that extends through an opening in the common plate 328 to the source region 322. The contact hole is filled with a conductive material to create the contact region 332. In the preferred embodiment, the contact hole is filled with tungsten (W) to form a tungsten "plug." A CMP step can then be performed to planarize the surface. A conductive layer is then deposited on the planarized surface, making contact with the contact region 332. The conductive layer is subsequently etched to form the bit line 334. In the preferred embodiment 300, the bit line 334 is formed from titanium-tungsten (TiW), and serves to commonly couple a column of identical memory cells.

A third interlevel isolation layer 342 is deposited over the bit line 334. The third interlevel isolation layer 342 is then etched to create strapping contact holes (not shown) which extend from through the first, second and third interlevel isolation layers (338, 340 and 342) to the top gate 318. In the preferred embodiment, these holes are formed in the strapping area of the array. The strapping contact holes are filled with a conductive material to form strapping vias. The strapping vias could be formed from, as just one example, a W plug. A conductive layer is then deposited on the third interlevel isolation layer 342, making contact with the strapping vias. The deposited conductive layer is then etched to form the strapping layer 336.

As will be recalled, the bottom gate 310 is coupled to the top gate 318 in the strapping area. In this manner, the top-to-bottom gate vias, in conjunction with the strapping vias, serve to reduce the effective resistance of the top gate 318 and bottom gate 310, and hence improve the speed in accessing the memory cell 300. It is noted that in the event the top-to-bottom gate via introduces too much resistance into the word line structure, the memory cell 300 could include a bottom gate strap via that connects the bottom word lines directly to the strapping layer 336. The bottom gate strap via could also be situated in the strapping area as well.

The use of both a bottom gate 310 and a top gate 318 in the pass transistor 302 has the advantage of reducing the leakage current from the drain region 320 to the source region 322. By activating the bottom gate 310 in conjunction with the top gate 318, greater control over the electric field in the channel region 324 results, leading to reduced leakage current when the pass transistor 306 is to be turned off. This aspect of the preferred embodiment is particularly advantageous when employed in a DRAM memory cell. By reducing the leakage current drawn between the source region 322 and the drain region 320, charge can be retained for a longer period of time on the storage capacitor 304. This can result in considerable power savings in the operation of the DRAM, because the DRAM can go for a longer period of time before a refresh operation is required.

The use of the bottom gate 310 and top gate 318 (i.e., "double-gate") pass transistor 302 allows for a reduced channel length, as short channel effects can be reduced. This translates into a smaller overall cell area, leading to a denser DRAM array arrangement.

In alternative embodiments, the bit line 334 and strapping layer 336 may be composed of metals such as Al, cladded by refractory metal combinations, such as TiN or TiW. Furthermore, the Al layer may include small percentages of silicon (Si) to reduce the diffusion of metal into the silicon substrate at the contact areas ("spiking"). Alternatively, the bit line 334 and strapping layer 336 may be copper (Cu) based, and constructed by electrolytically plating the Cu into trenches etched into the $SiO_2$, followed by a CMP step.

Figure 3:
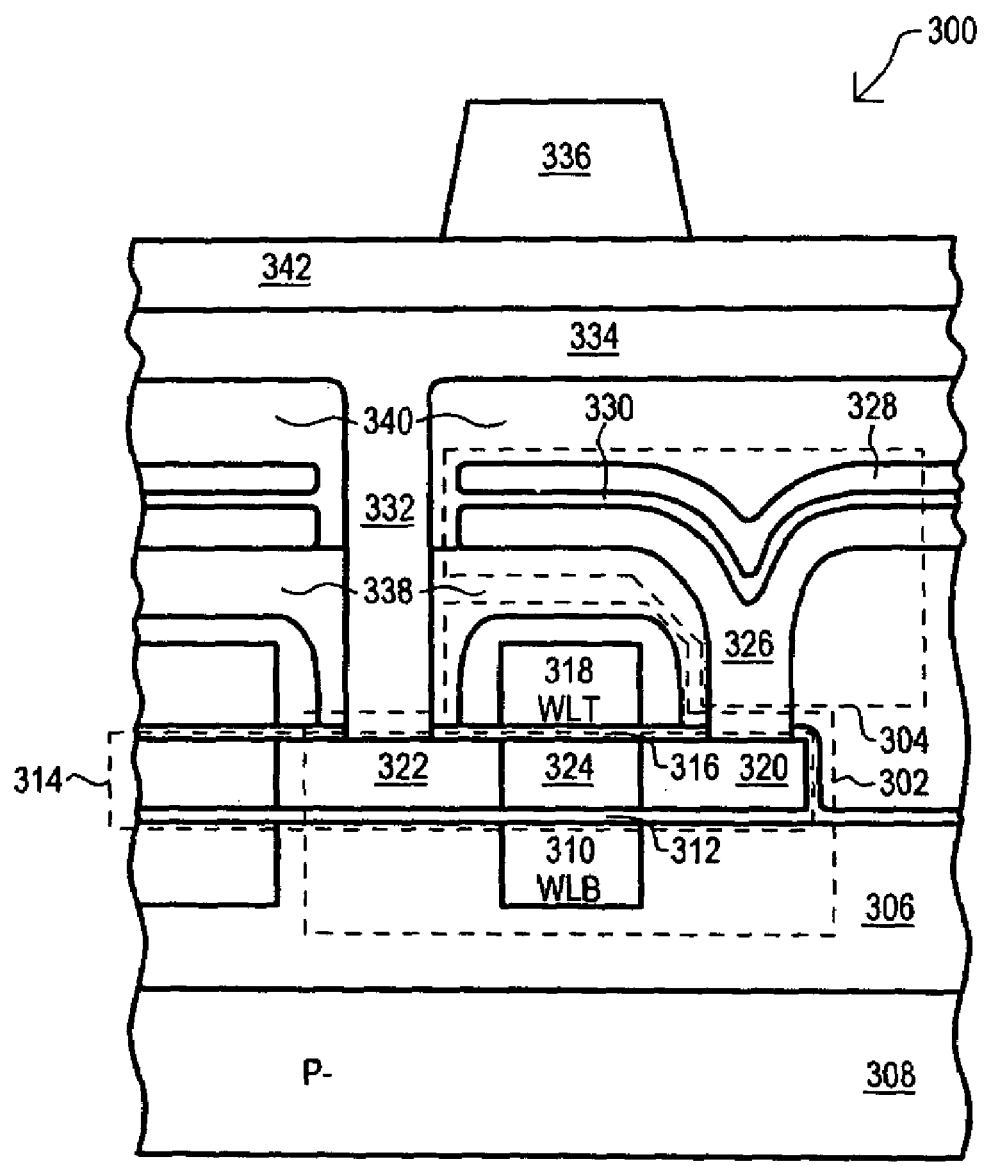
FIG. 3 is a side cross-sectional view illustrating a DRAM memory cell according to a preferred embodiment.

It is understood, that although the memory cell 300 in FIG. 3 is shown as a "capacitor-under-bit line" stacked cell structure, a "capacitor-over-bit line" (COB) stacked cell structure may be implemented by forming the bit line 334 before the storage capacitor 304. For example, after the formation of the first interlevel isolation layer 338, instead of etching a hole to the drain regions 320, a bit line contact hole could be etched to the source region 322. The contact region 332 will then be formed within the resulting hole. A planarization step (such as CMP) follows, and a conductive layer could be deposited and etched to form the bit line 334. Thus, in the COB type DRAM cell, the bit line 334 is situated on, and the contact region 332 extends through, the first interlevel isolation layer 338, instead of the first and second interlevel isolation layers (338 and 340). The COB cell structure then continues with the deposition of the second interlevel isolation layer 340. This layer may be planarized by CMP. A storage node hole is then etched through the first and second interlevel isolation layers (338 and 340) to the drain region 320. The storage node 326 is formed within the storage node hole, and the capacitor dielectric 330 and common plate 328 are formed as previously described. A third interlevel isolation layer 342 is then formed over the bit line 334. The word line strapping arrangement can then be formed as previously described.

It is also understood that the storage capacitor of the DRAM cell may be implemented in the form of a trench capacitor. In such an arrangement, following the formation of the pass transistor 302, an anisotropic reactive ion etch can be used to form a trench in contact with, or adjacent to the drain region 320. The storage node, capacitor dielectric and common plate can then be formed within the trench to create a trench-type storage capacitor.

Figure 4:
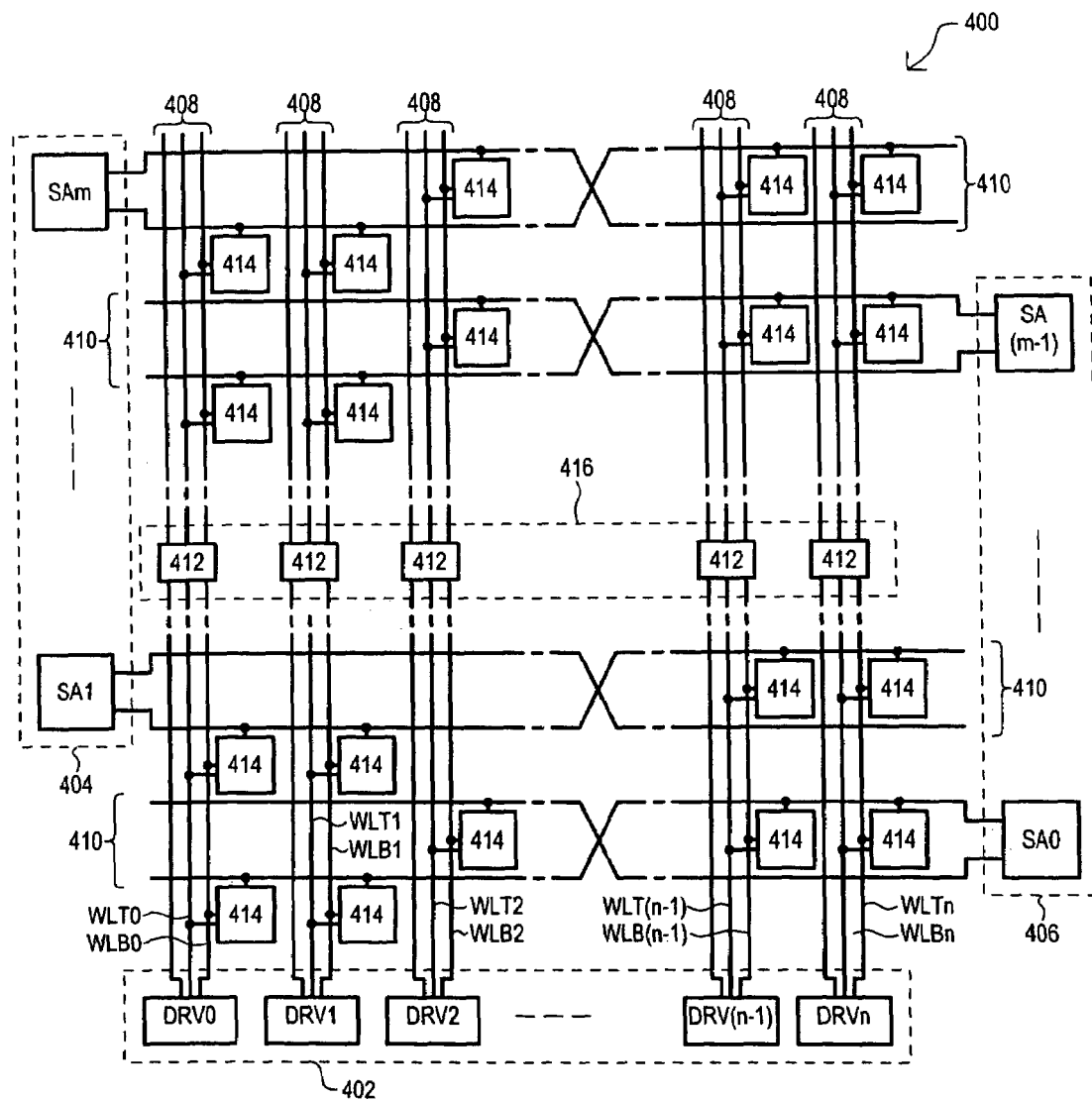
FIG. 4 is a block schematic diagram illustrating a DRAM array according to the preferred embodiment.

Referring now to FIG. 4, a block schematic is set forth, illustrating a DRAM array according to the preferred embodiment. The DRAM array includes a plurality of DRAM cells, each having the structure set forth in FIG. 3. The memory array is given the general reference character 400, and includes a word line driver section 402, a left sense amplifier section 404, a right sense amplifier section 406, a plurality of word lines 408, a plurality of bit lines 410 arranged in pairs, and a plurality of word line strap structures 412. The memory cells 414 are formed at the intersection of bit lines 410 and word lines 408.

Figure 2:
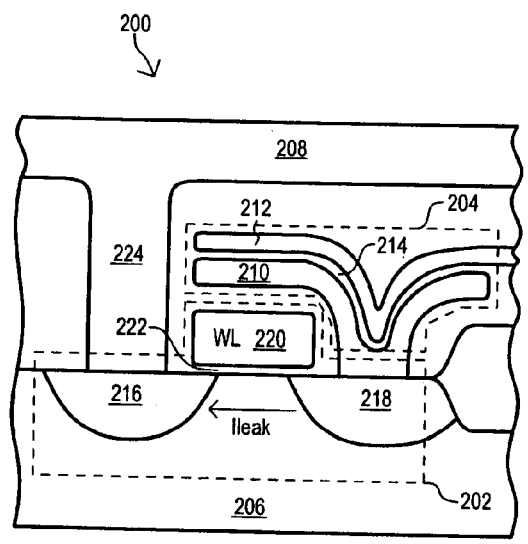
FIG. 2 is a side cross-sectional view of a prior art DRAM memory cell.

The word line driver section 402 contains a word line driver (DRV0–DRVn) corresponding to each word line 408 in the memory array 400. The word line drivers (DRV0–DRVn) differ from those of the prior art, in that each word line driver (DRV0–DRVn) drives a top word line, a bottom word line, and a word line strap. This is in contrast to the prior art word line drivers of FIG. 1, which each drive a single word line. The difference is best understood with reference to FIG. 3 in conjunction with FIG. 2. In the cross sectional view of FIG. 2, the prior art memory cell 200 contains only a single word line 220. It is this word line 220 that is driven by the word line driver DRV0 of FIG. 1. However, in FIG. 3, it can be seen that the memory cell 300 contains a bottom word line WLB (bottom gate 308), a top word line WLT (top gate 322), as well as a word line strap 336. All three of these structures are driven by the same word line driver (DRV0–DRVn). Because the three structures may increase the capacitive load on the word line driver (DRV0–DRVn), it may be desirable to employ word line drivers which have an increased drive strength than that of the prior art word line drivers set forth in FIG. 1.

In order to access memory cells 414 in the array 400, it is necessary to drive both the top word line and bottom word line associated with the accessed memory cell 414 to a high voltage level. As noted previously, each word line driver (DRV0–DRVn) in the word line driver section 402 drives a word line pair (WLB and WLT). For example, referring once again to FIG. 4, word line driver DRV0 is shown to drive a word line pair designated as WLB0 and WLT0.

Figure 5:
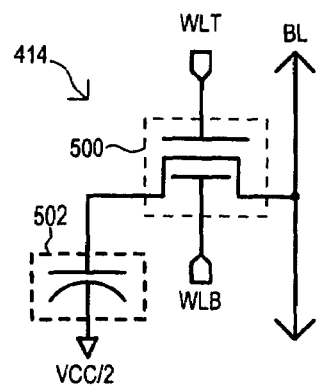
FIG. 5 is a schematic diagram of a memory cell of the preferred embodiment DRAM array of FIG. 4.

Referring now to FIG. 5, a schematic diagram of a memory cell is set forth in detail. The memory cell is designated by the general reference character 414, and includes a double-gate pass transistor 500 and a storage capacitor 502. As noted previously, in order to turn the pass transistor 500 on (into a conducting state), both control gates (coupled to WLB and WLT) of the pass transistor 500 must be at a high voltage level. It is desirable that both WLT and WLB be driven to at least one pass transistor threshold voltage above the array high supply level in order to maximize the charge level placed on, or read from, the storage capacitor 502. It is understood that every memory cell in that particular row is coupled to both WLB and WLT in the same fashion that the memory cell 414 is coupled to word line WLB and WLT in FIG. 5.

As noted above, the word lines 408 are strapped to a metal word line strap layer to reduce the effective resistance of the word line and improve the speed of the memory. The connection of the word line straps to the word lines occurs at the word line strap structures 412. The word line strap structures 412 are evenly spaced along the length of the word lines 408 and couple a metal word line strap layer to the top gate (WLT0–WLTn) and bottom gate (WLB0–WLBn) of each row of the array 400. In the preferred embodiment 400, the word line strapping structures 412 of each top and bottom word line pair are aligned with one another in the bit line direction, resulting in the formation of a column of word line straps 416. The column of word line straps 416 is void of memory cells, providing sufficient room for the placement of strapping vias and top-to-bottom word line vias. Multiple word line strap columns 416 are uniformly spaced across the array 400 at a frequency which depends upon the desired effective resistance of the word lines in the memory array.

Figure 6:
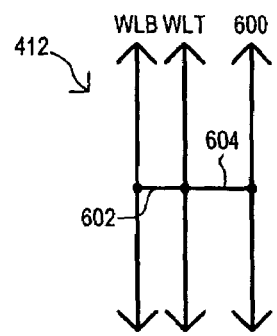
FIG. 6 is a schematic diagram of a word line strap structure of the preferred embodiment DRAM array of FIG. 4.

A schematic representation of a word line strapping structure 412 is set forth in FIG. 6. The word line strapping structure 412 sets forth a bottom word line WLB, a top word line WLT, and a word line strap layer 600. The bottom word line WLB is shown to be coupled to the top word line WLT by a top-to-bottom word line via 602. The word line strap layer 600 is connected to the top word line WLT by a strapping via 604.

If reference is made to FIG. 6 in conjunction with FIG. 3, the word line strap layer 600 of FIG. 6 corresponds to the strapping layer 336 of FIG. 3. As such, in the preferred embodiment 400, the word line strap layer 600 is a metal, such as Al. The top word line (WLT) of FIG. 6 corresponds with the top gate 318 of FIG. 3, and is formed from polysilicon, in the preferred embodiment. The bottom word line (WLB) of FIG. 6 corresponds with the bottom gate 310 of FIG. 3, and is also made of polysilicon in the preferred embodiment. As was previously noted, the function of the word line strapping structure 412 is to reduce the resistance of the word lines (WLB and WLT). As seen in FIG. 6, both word lines (WLB and WLT) are coupled to the word line strap layer 600 in the word line strap structures 412. If reference is made to FIG. 3, the bottom gate 310 of FIG. 3 does not have a silicide layer to reduce resistance, thus it is important that the bottom word line WLB be coupled to the metal word line strap layer 600, either directly, or by way of the top word line WLT.

Referring once again to FIG. 4, the left sense amplifier section 404 and the right sense amplifier section 406 are shown to be disposed on opposite sides of the array 400. In order to access every memory cell 414 within array 400, it is necessary to have a sense amplifier for every pair of bit lines 410 in the memory array 400. Because there are two sense amplifier sections (404 and 406), half of the sense amplifiers are in the left sense amplifier section 404, and the other half are in the right sense amplifier section 406. This arrangement allows for greater "pitch" (area in the column direction) per sense amplifier, making the layout of the sense amplifiers more efficient. The left sense amplifier section 404 can be considered to be coupled to the odd bit lines 410, thus the sense amplifiers within are designated by odd numbers (SA1, SA3, SA5 . . . SAm). The right sense amp section 406 can be considered to be coupled to the even bit lines 410, and so includes sense amplifiers having an even number designation (SA0, SA2, SA4 . . . SA(m−1)).

As set forth in FIG. 4, in the preferred embodiment 400, the pairs of bit lines 410 are "twisted" at their midpoint. This arrangement results in any noise on the bit lines being common mode noise. Noise sources can include signals coupled to the bit lines from parallel lines running above or below (for example y-select lines—not shown in FIG. 4). The sense amplifiers (SA0–SAm) of the preferred embodiment 400 have high common mode rejection ratios, thus the coupled noise is less likely to result in noise induced sensing errors.

The preferred embodiment array 400 can form part of a DRAM memory device. Such a device would also include a periphery area. While memory cells in the array 400 would include NMOS devices, the periphery could include the logic and decoding circuits formed with complementary metal(conductor)-oxide(insulator) semiconductor (CMOS) technology. The CMOS devices would include conventional (i.e., single gate) transistors. Alternatively, the preferred embodiment array 400 could be implemented as an integrated memory in a larger function semiconductor device.

Although the present invention has been described in detail, it should be understood that various changes, substitutions, and alterations could be made without departing from the spirit and scope of the invention as defined by the appended claims.

What is claimed is:

1. A random access memory cell, comprising:
   a data storage node; and
   a pass transistor coupled to the data storage node to provide charge transfer to and from the data storage node and including
      a source region,
      a drain region,
      a channel region disposed between the source region and the drain region, the channel region including a first channel side and a second channel side opposite to the first channel side,
      a first channel side control gate, and
      a second channel side control gate wherein the first channel side control gate is formed in a trench.

2. The random access memory cell of claim 1, further including:
   a substrate insulator layer providing electrical isolation between the first channel side control gate and a substrate.

3. The random access memory cell of claim 2, wherein:
   the trench is at least partially defined by the substrate insulator layer.

4. The random access memory cell of claim 1, further including:
   a first channel side gate insulating layer disposed between the first channel side control gate and the first channel side.

5. The random access memory cell of claim 4, wherein:
   the first channel side gate insulating layer include thermally grown silicon dioxide.

6. The random access memory cell of claim 1, wherein:
   the first channel side control gate includes doped polysilicon.

7. The random access memory cell of claim 1, wherein:
   a second channel side gate insulating layer disposed between the second channel side control gate and the second channel side.

8. The random access memory cell of claim 7, wherein:
   the second channel side gate insulating layer include thermally grown silicon dioxide.

9. The random access memory cell of claim 1, wherein:
   the data storage node includes polysilicon.

10. The random access memory cell of claim 1, wherein:
    the first channel side control gate and the second channel control side gate are electrically connected to a word line; and
    the word line is electrically connected to a word line driver.

11. The random access memory cell of claim 1, wherein:
    the data storage node is a first terminal of a storage capacitor.

12. The random access memory cell of claim 11, wherein:
    the storage capacitor includes a capacitor dielectric layer including nitride.

13. The random access memory cell of claim 11, wherein:
    the storage capacitor includes a capacitor dielectric layer including $Si_3N_4$.

14. The random access memory cell of claim 11, wherein:
    the storage capacitor includes a capacitor dielectric layer including $Ta_2O_3$.

15. The random access memory cell of claim 11, wherein:
    the storage capacitor includes a capacitor dielectric layer including $SrTiO_3$.

16. The random access memory cell of claim 11, wherein:
    the storage capacitor includes a capacitor dielectric layer including $BaSrTiO_3$.

17. The random access memory cell of claim 11, wherein:
    the storage capacitor includes a second terminal shared with at least another storage capacitor of another random access memory cell.

18. The random access memory cell of claim 11, wherein;
    the storage capacitor is a trench capacitor.

19. The random access memory cell of claim 11, wherein:
    the storage capacitor has a capacitor-over-bit line structure.

20. The random access memory cell of claim 11, wherein:
    the storage capacitor has a capacitor-under-bit line structure.

21. The random access memory cell of claim 1, wherein:
    the pass transistor is coupled to provide charge transfer between the storage node and a bit line; and
    the bit line includes metal from the group consisting of Ti, Al, and Cu.

* * * * *

UNITED STATES PATENT AND TRADEMARK OFFICE
CERTIFICATE OF CORRECTION

| | | |
|---|---|---|
| PATENT NO. | : 6,934,180 B1 | Page 1 of 1 |
| APPLICATION NO. | : 10/675042 | |
| DATED | : August 23, 2005 | |
| INVENTOR(S) | : Darryl G. Walker | |

It is certified that error appears in the above-identified patent and that said Letters Patent is hereby corrected as shown below:

Column 14, lines 11-12, "second channel control side gate" should be changed to --second channel side control gate--

Signed and Sealed this

Thirty-first Day of July, 2007

JON W. DUDAS
*Director of the United States Patent and Trademark Office*